United States Patent
Ladstätter et al.

(10) Patent No.: US 6,980,728 B2
(45) Date of Patent: Dec. 27, 2005

(54) OPTICAL ELEMENT HAVING TOTAL REFLECTION

(75) Inventors: Gerald Ladstätter, Klaus (AT); Markus Bohle, Dornbirn (AT)

(73) Assignee: Zumtobel Staff GmbH, Dornbirn (AT)

( * ) Notice: Subject to any disclaimer, the term of this patent is extended or adjusted under 35 U.S.C. 154(b) by 185 days.

(21) Appl. No.: 10/714,874

(22) Filed: Nov. 18, 2003

(65) Prior Publication Data

US 2004/0141303 A1 Jul. 22, 2004

Related U.S. Application Data

(63) Continuation of application No. PCT/EP02/05491, filed on May 17, 2002.

(30) Foreign Application Priority Data

May 18, 2001 (DE) .......................... 101 24 370

(51) Int. Cl.$^7$ .............................. G02B 6/10; F21S 11/00
(52) U.S. Cl. ...................... 385/146; 385/147; 385/901; 362/31; 362/339; 359/592; 359/597; 359/833; 359/837
(58) Field of Search ................................ 359/591, 592, 359/597, 833, 837; 385/146, 147, 901; 362/26, 31, 337, 339

(56) References Cited

U.S. PATENT DOCUMENTS

| | | | |
|---|---|---|---|
| 3,712,713 A | 1/1973 | Appledorn | 350/276 |
| 4,519,675 A | 5/1985 | Bar-Yonah | 350/259 |
| 5,839,823 A | 11/1998 | Hou et al. | 362/327 |
| 5,880,886 A | 3/1999 | Milner | 359/599 |
| 6,078,426 A | * 6/2000 | Siegfried | 359/599 |
| 6,092,904 A | 7/2000 | Tai et al. | 362/31 |
| 6,169,594 B1 | 1/2001 | Aye et al. | 349/196 |
| 6,222,689 B1 | * 4/2001 | Higuchi et al. | 359/837 |
| 6,224,223 B1 | * 5/2001 | Higuchi et al. | 362/31 |
| 6,523,980 B2 | 2/2003 | Sejkora et al. | 362/339 |

FOREIGN PATENT DOCUMENTS

| | | | | |
|---|---|---|---|---|
| DE | 19622670 A1 | 12/1997 | | F21S/11/00 |
| DE | 19637199 C2 | 3/1998 | | F21V/7/22 |
| DE | 19923225 A1 | 11/2000 | | G02B/5/00 |
| EP | 0800035 A1 | 10/1997 | | F21S/11/00 |

* cited by examiner

*Primary Examiner*—Akm Enayet Ullah
*Assistant Examiner*—Daniel Petkovsek
(74) *Attorney, Agent, or Firm*—Fitzpatrick, Cella, Harper & Scinto (57) ABSTRACT

An optical element (1) for reflecting and/or redirecting light rays (L1) entering therein and again emerging therefrom consists of a transparent base body (2) which is so structured and/or formed that, with the formation of reflection surfaces (8) bounding the base body (2), at least a part of the light rays (L1) impinging upon the reflection surfaces (8) upon emergence from the transparent base body (2) are totally reflected, and at least one cover body (9) arranged behind the reflection surfaces (8). The reflection surfaces (8), and the surfaces of the cover body or bodies (9) towards the reflection surfaces, are adapted to one another such that between them there remains a thin gap (10) or only point contacts exist.

15 Claims, 5 Drawing Sheets

Fig. 7
State of the art

OPTICAL ELEMENT HAVING TOTAL REFLECTION

CROSS REFERENCE TO RELATED APPLICATIONS

This is a Continuation of International Application PCT/EP02/05491 filed May 17, 2002, which in turn claims priority of German Application No. 101 24 370.7 filed May 18, 2001, the priorities of which are hereby claimed, said International Application having been published in German, but not in English, as WO 02/095290 A1 on Nov. 28, 2002. The disclosure of that International Application PCT/EP02/05491 is hereby incorporated by reference in its entirety, as if fully set forth herein.

BACKGROUND OF THE INVENTION

1. Field of the Invention

The present invention relates to an optical element for reflecting and/or redirecting light rays entering into it and then exiting from it, wherein the redirection or reflection is effected by means of a total reflection.

2. Description of the Related Art

Figure 7:
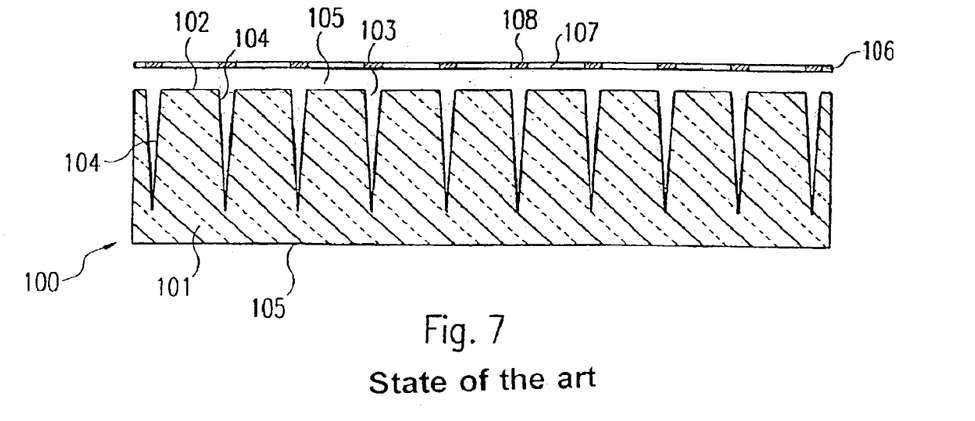
FIG. 7 depicts a known optical element.

Such an optical element is described for example in DE 199 23 255 A1 and illustrated in FIG. 7. This known optical element 100 consists of a plate-like base part 101 which at its upper side is occupied by a plurality of microprisms 102, which taper from their roots forming notches 103. The form of these microprisms 102 is such that light rays which enter into them from the upper side are totally reflected at the side walls 104, which has the consequence that the light rays leave the substantially flat light exit surface 105 of the optical element 100 only in a certain angular range. Due to this restriction of the light exit angle, light passing through this optical element 100 is perceived by an observer as dazzle-free.

However, an anti-dazzle effect takes place only for such light rays as enter via the upper side into the microprisms 102. In contrast, light which initially enters into the notches 103 and some time later enters info the optical element 101 is not rendered dazzle-free through the total reflection and is therefore undesired. For this reason, with the illustrated known optical element there is provided an additional cover element in the form of a grid 106 which is applied to the upper side of the optical element 100 and has light permeable regions 107 and light absorbing or reflecting regions 108. The arrangement of the light permeable and light absorbing regions 107 and 108 thereby corresponds to the arrangement of the microprisms 102 and notches 103, so that a light entry into the notches is prevented. In this way it is ensured that solely dazzle-free light leaves optical element 100 at its light exit side 105.

The production and arrangement of such a grid 106 is possible when the spacings between the microprisms 102 are sufficiently large, that is for example in the millimeter or centimeter range. However, the tendency is towards size reduction of the microprisms themselves and therewith also the spacings between them. Through this, however, it is ever more difficult to produce and arrange an exactly fitting cover grid in particular because, through heating, tolerances can become effective to such a degree that the functioning of the cover is prevented.

A similar problem arises with the light guide element known from U.S. Pat. No. 6,092,904. This consists of a flat transparent light guide body which has on one flat side a prism-like structure which is supposed to couple light rays out of the light guide element using total reflection. In order to make the total reflection possible, on its side having the prism structure the light guide body is covered over by a so-called compensation body which has a form complementary to the structure of the prisms and, with the aid of spacers, is slightly offset to the light guide body. Through this a thin gap is formed between the light guide body and the compensation body, which makes possible the total reflection at the side surfaces of the prisms. Thereby, the spacers are either separate elements which are applied before the light guide body and the compensation body are brought together, or are already formed on the compensation body, which can for example be produced in an injection molding process, in the production of the compensation body.

Also in the case of this known light guide element, for maintaining the total reflection it is of substantial significance that the light guide body and the compensation body are matched exactly to one another. If this is not the case, the provision of the gap necessary for the total reflection can no longer be ensured and the optical properties of the light guide element deteriorate. There again arises, however, the problem that the exactly matching production of light guide body and compensation body is ever more difficult and complex the smaller are the prism structures chosen to be.

From DE 196 37 199 A1 it is further known to fill the free space located between two totally reflecting surfaces of a light redirecting element with a powdery separation material. Although this separation material prevents the two reflecting surfaces coming directly into mutual contact during the production of the light redirecting element, it is problematic for the later employment of the light redirecting element. The free space filled by the separation material must later still be covered in order to prevent that the separation material later falls out again. Further, the powdery separation material does not form a homogeneous light-impermeable body which would completely prevent light entry at the notches of the light redirecting element.

SUMMARY OF THE INVENTION

It is thus the object of the present invention to provide a simpler and more economical possibility to prevent light entry into the notches. In particular is should be ensured that the free space next to the reflection surfaces, necessary for total reflection, is reliably maintained. At the same time there should be provided a certain protection for the sensitive outer surfaces of the microprisms.

The object is achieved by means of an optical element which distinguishes itself in that it is of a transparent base body which, with the formation of reflection surfaces, is so structured or formed that at least a part of the light rays incident upon the reflection surfaces on exiting from the transparent base body are totally reflected. Further, there is provided at least one cover body arranged behind the reflection surfaces, whereby the reflection surfaces and surfaces of the cover body or bodies towards the reflection surfaces are so adapted to one another that there remains between them a thin gap or only point contacts arise, wherein the cover body or bodies are applied to the base body, in accordance with the invention, in the liquid state The solution in accordance with the invention thus consists, analogously to U.S. Pat. No. 6,092,904, first not in covering the notch openings with a grid but instead to cover over at least those surfaces which are employed for total reflection and this in such a manner that in substance a thin gap remains. Due to this thin gap between the reflection surfaces and the cover body it remains ensured that also the desired total reflection continues to occur. Beyond this, the cover offers a protection which prevents a scratching or contamination of the reflection surfaces.

However, in accordance with the present invention, the covering over of the reflection surfaces is effected in a substantially simpler manner in that the cover body or bodies are applied to the base body in the liquid state. Thereby it is to be taken into consideration that the material of the transparent base body should not react with the cover material, since otherwise wide area connections between the transparent body and the cover material could arise at the reflection surfaces, with the consequence that the total reflection capability is lost. If, in contrast, suitable materials are employed there arises automatically a microscopic gap which gives rise to the total reflection. For example, for the case that the transparent base body is of polymethylmethacrylate (PMMA), there can be employed as cover material polyoxymethylene (POM) or polypropylene (PP).

The invention also relates to a method to which the advantages likewise apply.

Further developments of the invention are also disclosed and claimed herein.

Thus, for the case that the base body is formed by means of a plate-like base part with microprisms, it can be provided to cover not only the reflection surfaces but in general to completely fill the notches arranged between the microprisms with a cover body, in order through this to prevent light entry. This is in particular simple to carry out when at least the cover material is of plastics, since in this case the application can be effected in the liquid state, for example by means of injection molding.

In accordance with a further development or a further embodiment of the invention the upper side of the microprisms may be covered with a further transparent plate, which is of the same material as the base body and connected in one piece with the latter. This can be achieved in that after-the filling of the notches with the cover material a further layer of the material of the transparent base body is applied, which enters into a connection with the microprisms but not, however, with the cover bodies. An optical element configured in this way is preferentially suitable, when it has the form of a plate or pane, for a lateral or narrow side light entry and a light exit directed transversely thereto, in particular offset by in substance 90°, which in the case of a pane or plate is arranged on the broad side.

The known optical element illustrated in FIG. 7 serves as a so-called light guide element with which the light of a light source enters into the element via a light entry surface and leaves it again via a light exit surface. Further, with a suitable configuration of the microprisms such an element can also be employed as a reflector, wherein the light entry surface and the light exit surface are identical and a total reflection takes place at the oppositely lying microprisms. Also for this case, the covering over of the reflection surfaces with a cover material in accordance with the invention is of advantage, since the sensitive reflection surfaces are protected from external influences. There arises here the possibility of covering over the entire side of the transparent base body which has the microprisms with the cover material.

Beyond this, the cover material can also be employed to lend the reflector the necessary stability, insofar as the transparent base body itself does not manifest sufficient stability. There is for example the possibility of forming the transparent base body by means of a flexible foil which on one side has a microprism structure. If the foil is brought into a form corresponding to the reflector and then covered with the cover material, after the setting of the cover material the reflector has a sufficient stability. Through this the possibility is provided of producing even complex reflector forms in a simple and rapid manner.

Finally, the optical element in accordance with the invention can also be so configured that there is arranged within the transparent base body a light source, for example a light emitting diode. Through the transparent base body there is then formed a reflector which bundles the light emitted from the light source exclusively by means of total reflection.

BRIEF DESCRIPTION OF THE DRAWINGS

Below, the invention will be described in more detail with reference to the accompanying drawings.

DETAILED DESCRIPTION OF THE PREFERRED EMBODIMENTS

Figure 1:
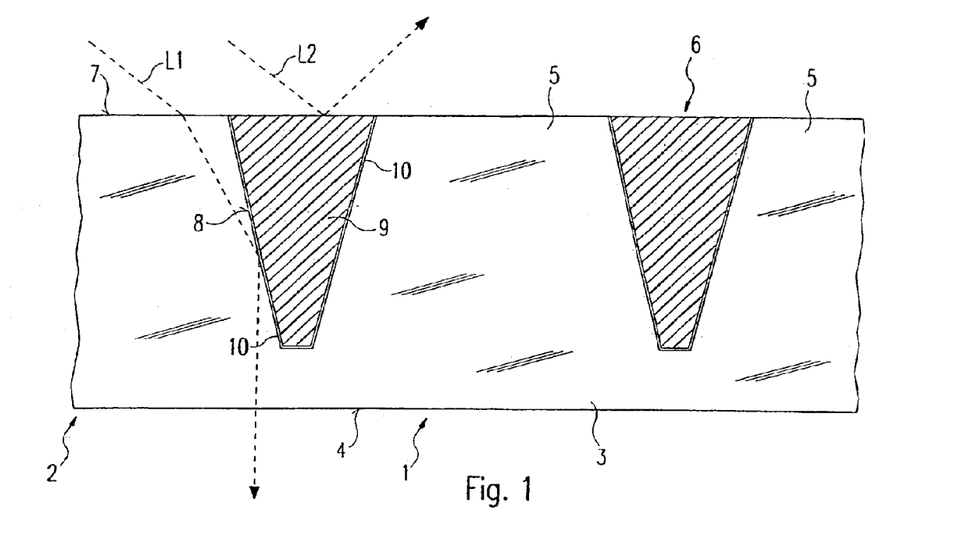
FIG. 1 depicts a first exemplary embodiment of an optical element in accordance with the invention.

The first embodiment of an optical element 1 in accordance with the invention illustrated in FIG. 1 corresponds to the optical element known from FIG. 7. It is likewise of a transparent base body 2, which is formed by means of a plate-like base part 3 the underside 4 of which forms the light exit surface of the optical element 1. On the side of the base part 3 opposite to the light exit side 4 there are a plurality of microprisms 5 which taper starting from their roots, so that there arise notches 6 between the microprisms 5.

The function of the microprisms 5 consists in that a light ray entering into the transparent base body 2 at their upper side 7 exits the light exit surface 4 within a predetermined angular range. The directing of the light is thereby effected by means of total reflection at the side surfaces of the microprisms, as is illustrated by the example of light ray L1. For this purpose the transparent base body 2 consists of a material having a refractive index which is greater than the refractive index of air. The two refractive indices determine a total refraction angle, whereby light rays which wish to leave the base body 2 at an angle which is greater than the total reflection angle are reflected.

Total reflection of the desired kind for the functioning of the optical element 1 takes place, however, only for light rays which enter into the base body 2 via the upper, sides 7 of the microprisms 5. For this reason it must be prevented that light rays can also enter the base body 2 via the notches 6 lying between the microprisms 5. In contrast to the known optical element illustrated in FIG. 7, no cover network is provided; instead in the case of the exemplary embodiment according to the invention illustrated in FIG. 1 the notches 6 are completely filled by cover bodies 9. The material of the cover bodies 9 is in the illustrated example formed to be reflecting, so that light rays incident on this are reflected, as is the case for example with the light ray L2.

Beyond this, the cover bodies 9 offer protection for the reflection surfaces 8 of the microprisms 5 so that the danger does not arise that these could be contaminated or scratched. In accordance with the invention, however, the cover bodies 9 are of a material which does not contact with the material of the base body 2 or only forms point contacts. Preferably, the base body 2 on the one hand and the cover bodies 9 on the other hand are of different materials or of materials with different refractive indices. Through this there arises a microscopic gap 10 between the side walls of the base body 2 and of the cover bodies 9, which ensures that the total reflection angle arising between the base body 2 and air remains unchanged. This thus means that through the filling of the notches 6 with the cover bodies 9 the desired effect of total reflection is not affected.

The base body 2 is preferably of plastics, for example of polymethylmethacrylate (PMMA) and thus can be produced in a simple manner for example by means of injection molding. Also for the cover material there is preferably employed a plastics, for example polyoxymethylene (POM) or polypropylene (PP). These two materials make no connection—as desired—with the polymethylmethacrylate (PMMA) of the base body 2, so that the gap 10 in accordance with the invention arises. Beyond this, these materials can be liquefied and thus likewise applied into the notches by means of injection molding.

A method for the production of the optical element illustrated in FIG. 1 may for example consist in first producing the transparent base body 2 by means of injection molding and then, as soon as the base body 2 has sufficiently hardened, filling the notches 6 with the cover material. The filling of the notches 6 or the production of the cover bodies 9 can be effected by means of liquid application of the material of the cover bodies 9, in particular plastics, for example by means of casting on, injection molding or injection compressing. A two-component injection molding or injection compressing is likewise advantageous. In the case of injection compressing, after the injection of the material in a manner known per se, the pressure in the mold chamber of the associated mold is increased, for example by means of a slight reduction of the mold volume, through which the material is pressed into the notches 6 with everywhere uniform pressure. This method of producing the optical element 1 is substantially more simple to carry out than the covering of the notches 6 with a cover grid.

Figure 2:
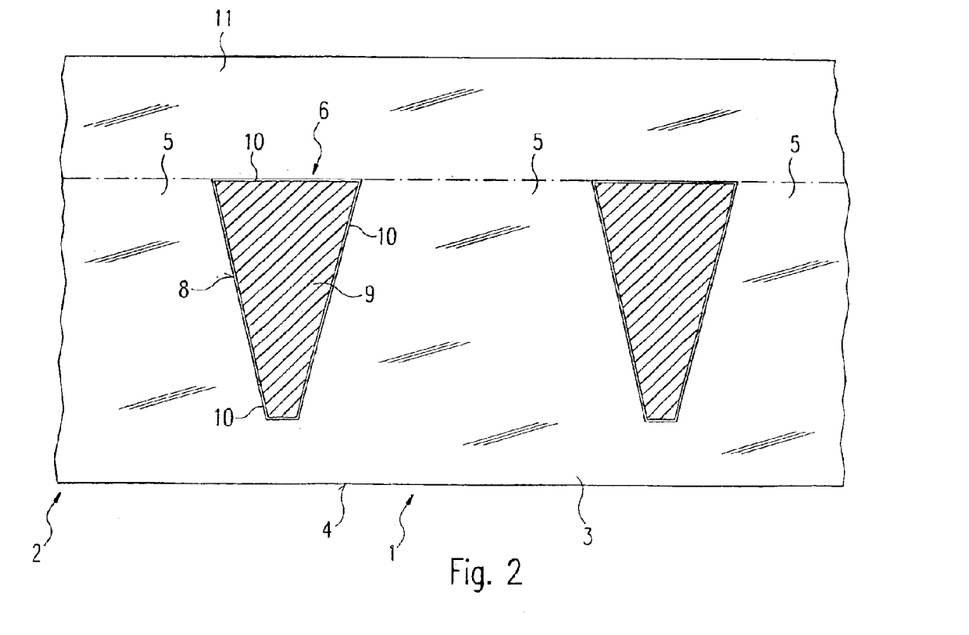
FIG. 2 depicts a further development of the optical element illustrated in FIG. 1 or a second embodiment of the optical element.

FIG. 2 shows a further development of the exemplary embodiment shown in FIG. 1 or a further exemplary embodiment and is concerned with a problem that occurs likewise with the optical element described in DE 199 23 225 A1. With the known optical element there is provided an additional transparent covering of the upper side of the microprisms, which is applied with the aid of a transparent adhesive medium. The difficulty here lies in the attainment of a homogenous connection between the upper sides of the microprisms and the covering. Through the employment of the adhesive medium inhomogeneities and gaps can arise, through which the optical properties of the overall element are impaired.

With the exemplary embodiment illustrated in FIG. 2 the upper sides of the microprisms 5 are likewise provided with a transparent covering 11 in particular in the form of a plate, whereby however, this covering 11 is of the same material as the base body 2 and is connected with this in one piece. This is attained in that, as already described above with reference to FIG. 1, first the base body 2 consisting of the base part 3 and the microprisms 5 is formed, for example by means of injection molding. In a second step the notches 6 located between the microprisms 5 are then filled with the cover material in order to form the cover bodies 9. In a subsequent step, the upper side is in turn then covered with the material of the base body 2, whereby the transparent plate 11 formed in this manner homogeneously connects with the microprisms 5, whilst on the other hand no connection occurs between the transparent plate 11 and the cover material. The cover bodies 9 are thus completely enclosed by the transparent material of the base body 2 and of the covering 11 with the formation of microscopic gaps 10. The application of the plate 11 or covering can likewise be effected by means of casting, injection molding or injection compressing.

With this, the present invention offers the possibility of producing such optical elements in a simple and rapid manner. In comparison with the known elements the optical properties can further be significantly improved, since no interfaces arise at which undesired light scattering can occur. Without the employment of a glue or the like there can be attained here a one-piece and homogenous connection between the base body 2 and transparent plate 11. The chain line illustrated in FIG. 2 is intended merely to make more clear that the material for the transparent plate 11 is first applied at a later point in time.

Such an optical element 1 is suitable in particular also for applications in which light is introduced laterally or at the narrow side into the transparent covering 11 and in substance so redirected by means of total reflection in the optical element that it emerges at the underside, in particular the broad underside.

Figure 2A:
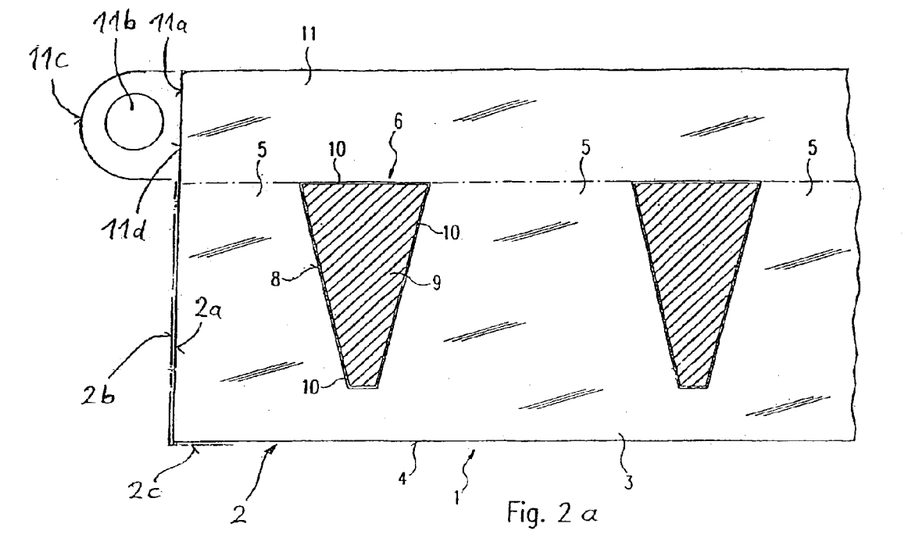
FIG. 2a depicts an end face of the optical element according to FIG. 2, which is supplemented to become a luminaire.

FIG. 2a shows by example the left end region of a luminaire in the case of which the optical element 1 is a so called light guide plate. Before the narrow side end face 11a of the transparent covering 11 there is arranged a light source 11b which irradiates the light into the face 11a. For improved exploitation of the light source 11b there may be arranged on the side of the light source 11d away from the covering 11a reflector 11c which reflects the light into the end face 11a. The end face 11a thus forms a light entrance 11d. The end surface region 2a of the body 2 can; if appropriate, be light permeably covered over so that the light of the light source 11b is irradiated only into the light entrance 11d. As covering 2b there may serve for example a light non-permeable layer or a frame, which may be constituted as holder for the optical element 1. The frame may have, for example on the inside and preferably on the underside, a carrier limb 2c on which the optical element 1 may lie. The light source 11b and/or the reflector 11c may also, if appropriate, be held on the frame. The frame can also serve for the mounting of the thus formed luminaire, for example as a surface-mounted luminaire or as a suspended luminaire. The light source 11b is preferably a tube, in particular a fluorescent tube, extending longitudinally of the end face 11a.

The opposite end region of the light may be formed correspondingly to the above-described end region.

The narrow sides of the transparent covering 11 which do not serve for light entry can be covered over in a light non-permeable manner, for example by means of a corresponding coating. Correspondingly, also the upper side of the transparent covering 11 and the narrow side of the base body 2 may be covered.

The optical element 1 is not restricted to the functional disposition described above and illustrated in the drawings according to FIGS. 1, 2 and 2a, in which the light is emitted at the underside. Within the scope of the invention it is also possible to arrange the optical element 1 on edge, so that it can for example serve as an emission element for a wall luminaire or serve as another kind of light display.

With regard to the two exemplary embodiments illustrated in FIGS. 1 and 2 it is to be noted that the microprisms 5 can in principle take any form suitable for attaining the desired directing of light. The covering of the reflection sides with the cover material in accordance with the invention has no influence on the form of the microprisms 5 since the total reflection takes place at the transition between the material of the transparent base body and the air located in the gap. The optical properties of the cover material are of no significance for this. Correspondingly there arises the possibility to employ as cover material a material which is reflecting, absorbing or even colored. The optical element can also be employed as a light guide element, whereby the light is coupled into the light guide element laterally and coupled out perpendicularly thereto.

Figure 3:
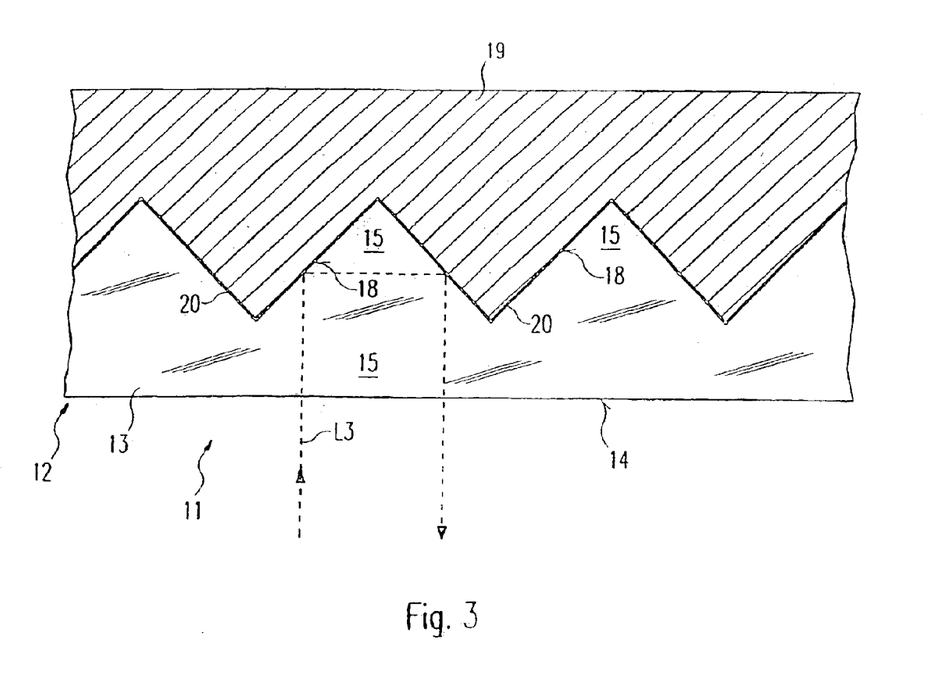
FIG. 3 depicts a further exemplary embodiment of an optical element in accordance with the invention, which serves as reflector.

FIG. 3 shows a further exemplary embodiment of the optical element in accordance with the invention which is now, however, employed as a reflector. The optical element 21 again is of a transparent base body 12 in the form of a plate-like base part 13 with microprisms 15 arranged thereon. The underside 14 of the base part 13 now, however, forms the light entry and light exit surface. A light ray L3 entering the transparent base body 12 from the underside is twice reflected at the side surfaces of the saw-tooth like microprisms 15 so that it again leaves the base body 2 at its underside 14.

The upper side of the transparent body 12 is completely covered over with a cover body 19, which again enters into no connection or only point connection with the material of the base body 12, so that between the cover body 19 and the microprisms 15 there arises a microscopically thin air gap 20. This means that also in this exemplary embodiment the reflection at the side walls 18 of the microprisms 15 arises through total reflection. The function of the cover body 19 consists in this case primarily in protecting the outer surface of the microprisms 15 from external influences. The reflection occurs solely through the form of the transparent base body 12 which is for example employable as a so-called retro-reflector such as is put to use for example in a cat's eyes.

Beyond this, through the selection of the cover material also the optics of the reflector can, however, be altered. For example the cover material may be constituted to be reflecting, in order to again increase the reflection properties. This is possible because total reflection only arises when the angle between the light ray and the totally reflecting surface fulfils certain conditions. Outside this angular range the light can, as before, leave the transparent body 12 at its upper side. On the other hand, there arises the possibility that light incident on the microprisms 15 from the upper side can again emerge at the underside 14 of the base body 12. In order to prevent this, the cover body 19 may for example be of a white material and thus diffusely return the light. On the other side there can also purposively be employed a transparent material as cover material, if a reflector with through-light characteristics is to be attained.

The production of the reflector can be effected in the same manner as the production of the optical element illustrated in FIG. 1. Alternatively thereto, there arises however also the possibility of first forming the cover body 19, for example again by means of injection molding, and then applying the transparent material for the base body 12. Finally, it would also be conceivable to produce the base body and the cover body initially separately from one another and only subsequently to bring them together to the illustrated arrangement.

The cover body in accordance with the invention can beyond this also provide for the necessary stability of the optical element, as will be explained with reference to FIGS. 4a–d. These Figures show a plurality of steps of a particularly simple method for producing a reflector.

Figure 4A:
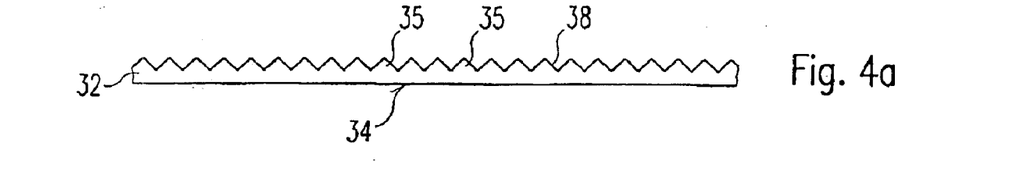
FIGS. 4a–d depict the individual steps of a method for the production of a reflector in accordance with the invention.

As starting material for the reflector there is employed a transparent flexible foil 32, which later forms the transparent base body. This foil has a flat light entry and light exit side 34, and a structured surface lying opposite thereto with microprisms 35. The microprisms 35 have the same form as the microprisms illustrated in FIG. 3 and are again intended to provide for a total reflection of light rays which enter into the foil from the underside 34.

Figure 4B:
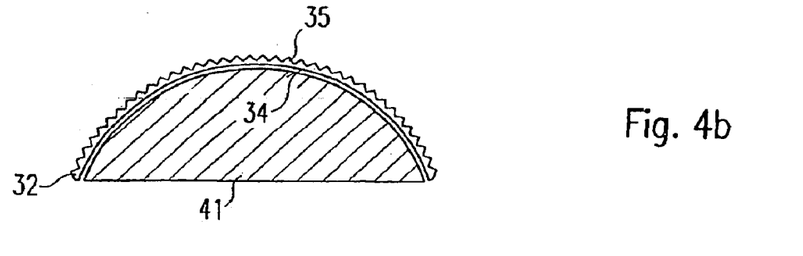
Figure 4C:
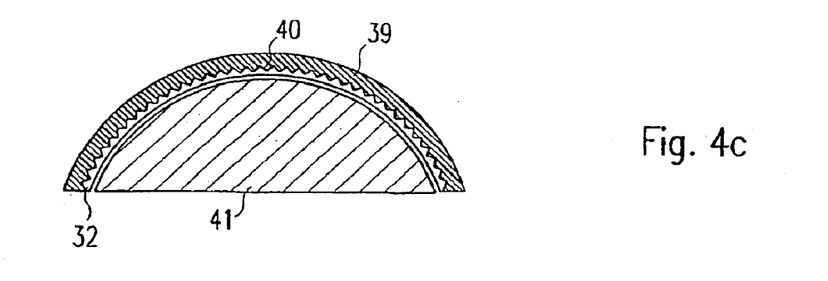
Figure 4D:
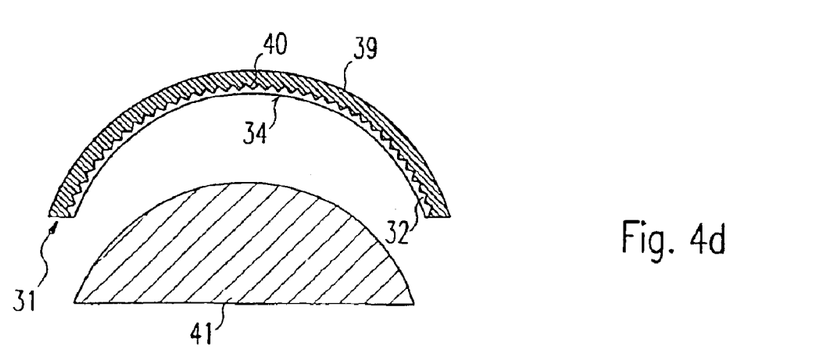

The foil 32 has no self-stability and is thus in a first step, illustrated in FIG. 4b, applied onto a shaping body 41, the outer contour of which corresponds to the desired reflector shape. The smooth underside 34 of the foil 32 thereby comes to bear against the upper side of the shaping body 41.

In a following step (FIG. 4c) the upper side of the foil 32 is then covered with a cover material 39, which in accordance with the invention enters into no chemical connection with the foil 32, so that at the upper sides of the microprisms 35 again the microscopically thin gap 40 arises. The settable cover material may be for example sprayed on or cast on.

In a final step (FIG. 4d), after the hardening of the cover material to a cover body 39, the total arrangement is then removed from the shaping body 41, so that a reflector 31 is formed which is constituted like the reflector described in FIG. 3. The solidified cover body 39 hereby provides for a sufficient stability.

With the method just described, complicated reflector shapes can also be produced in a simple and rapid manner. In particular it is substantially simpler to produce a flexible foil and then bring it to the desired shape, than to form from the start a curved transparent base body, which has a microprism structure on its upper surface.

Figure 5:
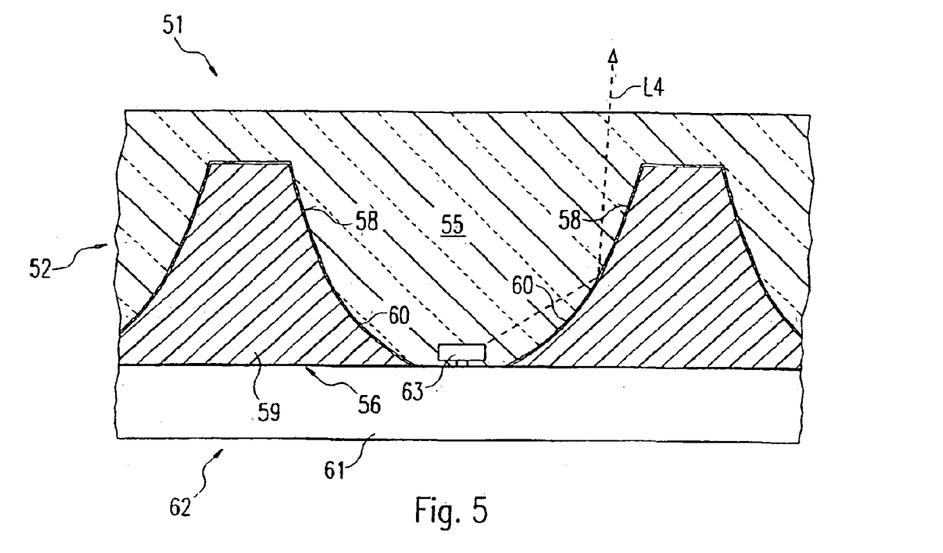
FIG. 5 depicts a further exemplary embodiment of an optical element in accordance with the invention, for forming a light emitting diode arrangement.

A further field of application for the optical element in accordance with the invention is illustrated in FIG. 5. This FIG. 5 shows a light emitting diode arrangement 62 which is of a plurality of LED chips 63 arranged on a board 61. If a plurality of such LEDs 63 are arranged on a board 61, overall a sufficiently high light intensity can be attained so that such a light emitting diode arrangement 62 can also be put to use for illumination purposes. For reasons of process economy, however, the light emitting diodes 63 are preferably arranged without housings; that is, only the light emitting chip (the so-called die) is attached to the board 61. Despite this it is desired to bundle the light rays emitted from the light emitting diodes 63, whereby the application of individual reflectors for this purposes would however be extremely complex.

The exemplary embodiment of the optical element in accordance with the invention illustrated in FIG. 5 is suitable for bundling the radiation of the light emitting diodes 63. For this purpose, the light emitting diodes are arranged within a bell-shaped transparent body 55, the form of which corresponds to the form of a suitable reflector. In order thus to attain the same effect as with a reflector it is necessary again to so configure the transparent base body 55 that light rays incident on its side walls 58 are reflected, as is illustrated by way of example by the light ray L4.

As also in the exemplary embodiments of FIGS. 1–4 the reflection is effected thus by means of total reflection which is ensured in that the transparent base body 55 is surrounded by air—more precisely is again surrounded by an air gap 60. This is achieved in that the free space 56 between the bell-like transparent base bodies 55 is filled with cover material which enters into no connection with the material of transparent bodies 55, so that again a microscopic gap 60 arises for ensuring total reflection.

The production of the light emitting diode arrangement 62 occurs preferably in the following manner. After the arrangement of the LEDs 63 on the board 61, there are first applied to the board 61 the pyramid-like elevations 59 which are of the cover material, for example by means of gluing or the like. In a subsequent step, the overall arrangement is then covered over with the transparent material, so that this provides the illustrated arrangement. This process also distinguishes itself in that a per se relatively complicated structure can be produced through few and simple process steps. In particular the method in accordance with the invention offers the possibility of forming undercuts.

Figure 6:
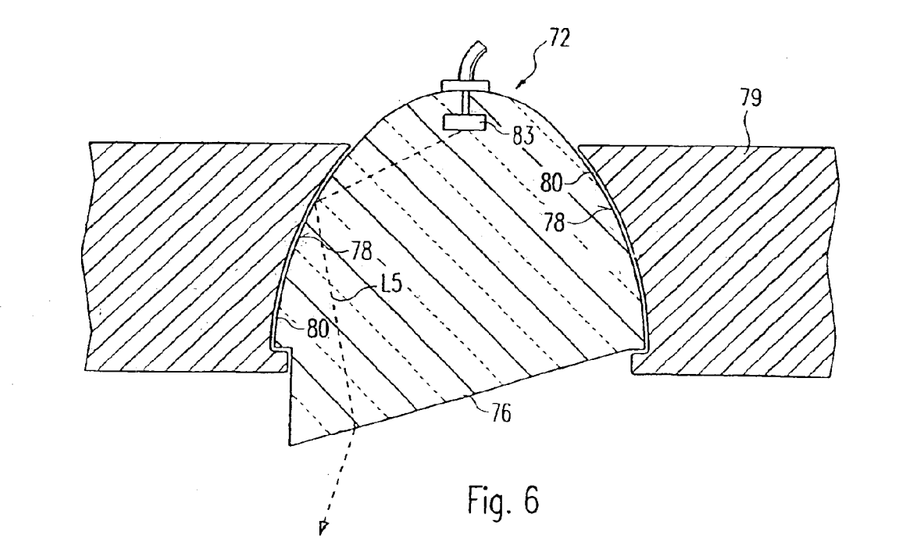
FIG. 6 depicts a further exemplary embodiment of an optical element in accordance with the invention, for bundling the light of a light emitting diode.

The last exemplary embodiment, illustrated in FIG. 6, is concerned likewise with the problem of the, arrangement of light emitting diodes for illumination purposes. Here, a light emitting diode 83 is first cast into an again bell-shaped transparent plastics body 72, which at the same time is to serve as reflector for the light rays L5 emitted from the light emitting diode. At its underside the plastics body 72 further has an oblique extension part 76 through which the exiting light is again laterally deflected so that through this the rays can be purposively directed into a desired direction.

The holding of the plastics block 72 is effected by means of a carrier layer 79 of the cover material, into which the transparent plastics block 79 is cast. Again, the transparent block 72 and the holder 79 are of materials which enter into no intimate connection so that correspondingly a thin air gap 80 forms between the plastics block and the holder 79. This has on the one hand the consequence that the light rays emitted from the LED 83 and incident on the wall of the plastics block 72 are totally reflected, beyond this, the plastics block 72 and therewith the extension part 76 can be subsequently rotated with respect to the holder 79. Through this, there arises the possibility of subsequently making a change of the direction in which the light is to be emitted.

The present invention distinguishes itself in that optical elements with excellent optical properties can be achieved which are suitable for a plurality of possible applications. Beyond this, these optical elements can be produced in a simple and economical manner. Even complicated structures, which would be difficult to achieve with conventional methods, are possible without great effort.

What is claimed is:

1. An optical element for reflecting and/or redirecting light rays entering therein and again emerging therefrom, said optical element comprising:

a transparent base body which is so structured and/or formed that, with the formation of reflection surfaces bounding the base body, at least a part of the light rays impinging upon the reflection surfaces upon emergence from the transparent base body are totally reflected; and at least one cover body having cover body surfaces arranged behind the reflection surfaces, said base body and said at least one cover body being of materials which do not react with each other and, the reflection surfaces and the corresponding cover body surfaces providing between them a microscopic gap which results from applying, while in the liquid state, one of said base body and said at least one cover body to the other while in the liquid state.

2. An optical element according to claim 1 wherein, the base body comprises a plate-like base part, one side of which is occupied by microprisms which taper, starting from their roots, with the formation of depressions, whereby the side surfaces of the microprisms form the reflection surfaces and the cover bodies fill the depressions between the microprisms.

3. An optical element according to claim 2 wherein, said microprisms have upper sides which are covered by a transparent plate which is of the same material as the base body and which is connected to the base body to form one piece.

4. An optical element according to claim 2 wherein, said one side of the base body is completely covered over by the cover body.

5. An optical element according to claim 2 wherein, said body is plate-like.

6. An optical element according to claim 2 wherein, said body is curved.

7. An optical element according to claim 1 wherein at least one light emitting diode is arranged within the transparent base body.

8. An optical element according to claim 1 wherein, said at least one cover body is reflective.

9. An optical element according to claim 1 wherein, said at least one cover body applied to said base body by means of casting or injection molding or injection compressing.

10. An optical element according to claim 1 wherein, said transparent base body and said at least one cover body are of different materials.

11. An optical element according to claim 10 wherein, said base body and said at least one cover body are of materials which do not connect said bodies but instead define an air gap between them.

12. An optical element according to claim 1 wherein, the transparent base body and/or said at least one cover body are of plastic.

13. An optical element according to claim 12 wherein, the transparent base body is of polymethylmethacrylate (PMMA).

14. An optical element according to claim 12 wherein, said at least one cover body is of polyoxymethylene (POM).

15. An optical element according to claim 12 wherein, said at least one cover body is of polypropylene (PP).

* * * * *